United States Patent
Diemer

(10) Patent No.: US 9,455,115 B2
(45) Date of Patent: Sep. 27, 2016

(54) METHOD OF ADJUSTING A STIGMATOR IN A PARTICLE BEAM APPARATUS AND A PARTICLE BEAM SYSTEM

(71) Applicant: Carl Zeiss Microscopy GmbH, Jena (DE)

(72) Inventor: Simon Diemer, Röttingen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 14/574,190

(22) Filed: Dec. 17, 2014

(65) Prior Publication Data

US 2016/0181055 A1 Jun. 23, 2016

(51) Int. Cl.
*H01J 37/15* (2006.01)
*H01J 37/147* (2006.01)
*H01J 37/12* (2006.01)
*H01J 37/285* (2006.01)

(52) U.S. Cl.
CPC .............. *H01J 37/147* (2013.01); *H01J 37/12* (2013.01); *H01J 37/15* (2013.01); *H01J 37/285* (2013.01); *H01J 2237/12* (2013.01); *H01J 2237/15* (2013.01); *H01J 2237/153* (2013.01); *H01J 2237/1534* (2013.01); *H01J 2237/285* (2013.01)

(58) Field of Classification Search
CPC ...... H01J 37/147; H01J 37/12; H01J 37/285; H01J 2237/12; H01J 2237/15; H01J 2237/285; H01J 37/153; H01J 37/141; H01J 2237/1501; H01J 2237/153; H01J 2237/1532; H01J 2237/1534
See application file for complete search history.

(56) References Cited

U.S. PATENT DOCUMENTS 3,444,427 A * 5/1969 Rauch .................... H01J 37/153
315/14
4,214,163 A * 7/1980 Namae .................... H01J 37/28
250/310

(Continued)

FOREIGN PATENT DOCUMENTS

DE 1216455 5/1966
EP 0580212 B1 12/1999
EP 1202320 B1 10/2011

*Primary Examiner* — Wyatt Stoffa
(74) *Attorney, Agent, or Firm* — Alston & Bird LLP

(57) ABSTRACT

A method of adjusting a stigmator in a particle beam apparatus comprises directing a particle beam onto a sample wherein the particle beam traverses a quadrupole field 37 generated by energizing at least four field generators of the stigmator; acquiring first and second images of the sample at different field strengths of the quadrupole field while energizing the at least four field generators according to a first setting of a plurality of settings; acquiring third and fourth images of the sample at different field strengths of the quadrupole field 37 while energizing the at least four field generators according to a second setting of the plurality of settings; determining a plurality of image displacements based on the first, second, third and fourth images; determining an optimum setting of the at least four field generators based on the plurality of image displacements and the plurality of settings.

19 Claims, 5 Drawing Sheets

(56) References Cited

U.S. PATENT DOCUMENTS

| | | | | |
|---|---|---|---|---|
| 4,392,054 A * | 7/1983 | Sato | H01J 37/153 | 250/307 |
| 4,764,818 A * | 8/1988 | Crew | G11B 9/10 | 315/382 |
| 5,389,858 A * | 2/1995 | Langner | H01J 37/141 | 250/396 ML |
| 5,869,838 A * | 2/1999 | Stengl | H01J 37/12 | 250/396 R |
| 5,952,667 A * | 9/1999 | Shimizu | B82Y 10/00 | 250/396 ML |
| 6,838,667 B2 * | 1/2005 | Tsuneta | H01J 37/21 | 356/401 |
| 6,864,493 B2 * | 3/2005 | Sato | H01J 37/1471 | 250/491.1 |
| 7,605,381 B2 * | 10/2009 | Sato | H01J 37/1471 | 250/307 |
| 2002/0056808 A1 * | 5/2002 | Tsuneta | H01J 37/21 | 250/306 |
| 2006/0060781 A1 * | 3/2006 | Watanabe | B82Y 10/00 | 250/310 |
| 2013/0146766 A1 * | 6/2013 | Ohshima | H01J 37/265 | 250/310 |
| 2013/0175447 A1 * | 7/2013 | Sohda | H01J 37/153 | 250/310 |
| 2013/0320846 A1 * | 12/2013 | Yamada | H01J 29/64 | 315/5.35 |

* cited by examiner

METHOD OF ADJUSTING A STIGMATOR IN A PARTICLE BEAM APPARATUS AND A PARTICLE BEAM SYSTEM

FIELD

The invention relates to a method of adjusting a stigmator in a particle beam apparatus and a particle beam system having a stigmator. In particular, the invention relates to a method of adjusting a quadrupole field generated by at least four field generators of a stigmator in a particle beam apparatus and a particle beam system configured to perform said method.

BACKGROUND

A particle beam apparatus conventionally comprises an optical element such as an objective lens. The optical element, in particular an objective lens, usually suffers from imperfections so that its desired idealized functionality may not be provided. An objective lens may have, for example, an astigmatism deteriorating optical properties so that the focal length of the objective lens is dependent of the position at which a beam is incident onto the objective lens.

In a particle beam system such as a particle beam microscope, an astigmatism of an objective lens may be corrected for by utilizing a stigmator. The stigmator functions analog to a cylinder lens, i.e. a beam incident on the stigmator is spread along a principle axis of the stigmator and focused in a direction perpendicular to the principle axis and the direction of the beam.

Conventionally, a stigmator in a particle beam apparatus provides a quadrupole field acting analog to a cylinder lens. However, the quadrupole field must be properly aligned to the particle beam in order to properly compensate the astigmatism of the objective lens. If not properly aligned, a particle beam of the particle beam apparatus traversing the stigmator undergoes an unwanted deflection. Furthermore, a variation of, for example, an excitation of the stigmator results in an undesired movement of an acquired image.

Conventionally, the adjusting of the stigmator to the particle beam is performed manually by varying the configuration of the stigmator until image movements become minimum when periodically changing the strength of the stigmator excitation by a small amount. Manually adjusting the stigmator is elaborate and time consuming. In addition, the user manually adjusting the stigmator must be experienced in order to achieve an appropriate adjustment. If the quadrupole field of the stigmator is not properly aligned to the optical axis of the particle beam system, in addition, the adjusting of the stigmator leads to a movement of the image and makes the adjustment of the stigmator even more laborious.

The present invention has been made taking the above considerations into account.

SUMMARY

Some embodiments of the invention provide a method of adjusting a stigmator in a particle beam apparatus. Further embodiments of the invention provide a particle beam system configured to perform a method which adjusts a stigmator in a particle beam apparatus fully automated at high accuracy and high speed.

According to some embodiments, a method of adjusting a stigmator in a charged particle beam apparatus comprises directing a charged particle beam onto a sample wherein the particle beam traverses a quadrupole field generated by energizing at least four field generators of the stigmator.

The charged particle beam may be a beam of charged particles, in particular, electrons or ions and have a finite width in a direction orthogonal to its direction of propagation. The stigmator may be a magnetic stigmator comprising coils as field generators or an electric stigmator comprising electrodes as field generators.

The method further comprises acquiring first and second images of the sample at different field strengths of the quadrupole field while energizing the at least four field generators according to a first setting of a plurality of settings of the at least four field generators, and acquiring third and fourth images of the sample at different field strengths of the quadrupole field while energizing the at least four field generators according to a second setting of a plurality of settings of the at least four field generators. The plurality of settings comprises at least two mutually different settings or, alternatively, mutually different settings only.

The acquiring of the first, second, third and fourth images of the sample may be performed by using a detector. For example, an electron detector may be used to detect electrons emerging from the sample such as electrons transmitted through the sample, electrons backscattered from the sample, electrons mirrored from the sample, secondary electrons emitted due to an interaction of the particle beam with the sample or the like. The first image of the sample is acquired at a different field strength of the quadrupole field compared to the field strength of the quadrupole field present during the acquisition of the second image of the sample. However, during the acquisition of the first and second images of the sample the at least four field generators are energized according to the same first setting of the plurality of settings. Analogously, the third and fourth images are acquired.

The method further comprises determining a plurality of image displacements, wherein a first image displacement of the plurality of image displacements is determined based on the first and second images, and wherein a second image displacement of the plurality of image displacements is determined based on the third and fourth images. For example, structural information present in both the first and the second images may be used to determine the first image displacement. For this, several different methods are known such as cross-correlating first and second images using (fast) Fourier transformation. The second image displacement is determined analogously. The plurality of image displacements comprises at least two image displacements.

The method further comprises determining an optimum setting of the at least four field generators based on the plurality of image displacements and the plurality of settings of the at least four field generators so that an image displacement between two images acquired while energizing the at least four field generators according to the optimum setting at field strengths differing from each other by 1% of a maximum excitation of the at least four field generators is less than a predetermined limit. In particular, the image displacement between the two images vanishes when the at least four field generators are energized according to the optimum setting at field strengths differing from each other by 1% of a maximum excitation of the at least four field generators.

Therefore, the optimum setting is characterized in that an image displacement of the two images is less than the predetermined limit. The two images are acquired when the at least four field generators are energized according to the optimum setting. Further, the two images are acquired at different field strengths of the at least four field generators. For example, a first one of the two images may be acquired at a field strength amounting to 10% of the maximum excitation of the at least four field generators while a second one of the of the two images may be acquired at a field strength amounting to 9% or 11% of the maximum excitation of the at least four field generators. Each of the field generators of the stigmator may be excited up to a maximum value, i.e., a maximum excitation of the respective field generator. The maximum excitation of the at least four field generators may be, for example, one of a largest, smallest and average value of the individual maximum excitations of each of the at least four field generators.

The predetermined limit may amount to 100 nm, in particular 50 nm, in particular 10 nm, in particular 5 nm, or more in particular 1 nm. Those skilled in the art will recognize that the predetermined limit as well as the definition of the maximum excitation of the at least four field generators may be altered appropriately.

The optimum setting of the at least four field generators may be determined by evaluating a mathematical formula, the only constituents of which are the plurality of image displacements and the plurality of settings of the at least four field generators. However, the only constituents of the mathematical formula may further comprise one or multiple constants as well as or alternatively one or multiple parameters. In particular, the parameters are independent of the plurality of image displacements and the plurality of settings of the at least four field generators. Constants may be plain numbers, i.e., numbers independent of arguments, such as 1, 2, rational numbers or irrational numbers. Parameters may be, for example, numbers depending on arguments. In particular, the plurality of image displacements and the plurality of settings may enter the mathematical formula directly, i.e., functions and the like, the arguments of which are the plurality of image displacements and the plurality of settings may not enter the mathematical formula. In particular, the parameters may not depend on any of the plurality of image displacements and the plurality of settings.

According to exemplary embodiments, the determining of the optimum setting of the at least four field generators is free of determining, in particular calculating, at least one parameter depending on at least one of the properties of the charged particle beam, an axis deviation of the charged particle beam from an optical axis of an objective lens and the like of the particle beam apparatus, and a particle optical system of the charged particle beam apparatus.

The inventors found out that it is possible to determine the optimum setting of the at least four field generators without providing specific information of the particle beam apparatus except for the plurality of settings. In particular, it is not necessary to provide properties of the particle beam such as a charge distribution of the particles, i.e. a distribution of the charges of the particles of the particle beam, a distribution of the particle energies, an axis deviation, e.g. a displacement of the particle beam relative to an optical axis of a component of the particle beam apparatus such as an objective lens. Furthermore, the determining of the optimum setting may be performed without providing the properties of the particle optical system comprising, for example, an acceleration energy at which particles emerging from a particle source are accelerated by extraction electrodes, a condenser lens system, a deflection system for, e.g., deflecting the particle beam relative to an optical axis of the particle beam apparatus.

According to exemplary embodiments, the mathematical formula is given by or representable as $$\vec{s}_0 = H\left[\frac{F\vec{d}_1 \cdot G\vec{s}_2 - F\vec{d}_2 \cdot G\vec{s}_1}{F(\vec{d}_1 - \vec{d}_2)}\right]$$

wherein $\vec{s}_0$ denotes a two-dimensional representation of the optimum setting, $\vec{d}_1$ and $\vec{d}_2$ denote a two-dimensional representation of the first and second image displacements, respectively, $\vec{s}_1$ and $\vec{s}_2$ denote a two-dimensional representation of the first and second settings, respectively, F denotes an operator acting on $\vec{d}_1$ and $\vec{d}_2$, G denotes an operator acting on $\vec{s}_1$ and $\vec{s}_2$, and H denotes an operator acting on $$\frac{F\vec{d}_1 \cdot G\vec{s}_2 - F\vec{d}_2 \cdot G\vec{s}_1}{F(\vec{d}_1 - \vec{d}_2)}.$$

According to further exemplary embodiments, the operators F, G and H comprise at least one of an operation of scaling, an operation of rotation, an operation of inversion, an operation of conjugation and an operation of transposing.

The operation of conjugation may, for example, change a sign of one of the constituents of one of the two-dimensional representations, and the operation of transposing may, for example, change an order of one of the two-dimensional representations.

According to exemplary embodiments, the mathematical formula is given by or representable as $$\underline{s}_0 = \frac{F\underline{d}_1 \cdot \underline{s}_2 - F\underline{d}_2 \cdot \underline{s}_1}{F(\underline{d}_1 - \underline{d}_2)}$$

wherein $\underline{s}_0$ denotes a complex number representing the optimum setting, $\underline{d}_1$ and $\underline{d}_2$ denote complex numbers representing the first and second image displacements, respectively, $\underline{s}_1$ and $\underline{s}_2$ denote complex numbers representing the first and second settings, respectively, and F denotes an operator acting on $\underline{d}_1$ and $\underline{d}_2$ and comprising at least one of an operation of scaling and an operation of conjugation.

According to exemplary embodiments, the following observations hold for a plane selected such that it is oriented orthogonally to the charged particle beam and such that it intersects at least one of the at least four field generators:

a characteristic point of the quadrupole field is positioned at a first position in the selected plane when energizing the at least four field generators according to the first setting, the characteristic point of the quadrupole field is positioned at a second position in the selected plane when energizing the at least four field generators according to the second setting, and a central ray of the charged particle beam is deflected by the quadrupole field by less than a predetermined angular limit when the charged particle beam traverses the quadrupole field through the characteristic point.

The central ray of the particle beam is located in the center of the particle beam along its direction of propagation. In general, due to the quadrupole field, the charged particle beam is deflected, i.e., the direction of propagation of the charged particle beam having past the quadrupole field is changed with respect to a direction of propagation of the charged particle beam prior to entering the quadrupole field by a deflection angle. Therefore, the deflection angle is defined by the directions of propagation before and after the particle beam has interacted essentially with the quadrupole field.

Therefore, the first setting of the at least four field generators may be characterized in that a characteristic point of the quadrupole field, for example, a point of the quadrupole field where charged particles of the particle beam are not deflected by the quadrupole field or deflected by the quadrupole field by less than the predetermined angular limit (i.e. the deflection angle is less than the predetermined angular limit) is positioned at a first position in the selected plane wherein said selected plane is essentially oriented orthogonally to the charged particle beam and intersects at least one of the at least four field generators. In general, when the at least four field generators are energized according to the first setting, the central ray of the particle beam traverses the selected plane at a distance from the characteristic point of the quadrupole field positioned at the first position, i.e. in general, the first position is located at a distance from the charged particle beam and the charged particle beam is deflected by more than the predetermined angular limit. However, if the charged particle beam traverses the quadrupole field through the characteristic point or a region in close proximity of the characteristic point, the central ray of the charged particle beam is not deflected by the quadrupole field or deflected by the quadrupole field by less than the predetermined angular limit. The second setting has analogous properties. In general, the first setting is different from the second setting and the first position is different from the second position.

The angular limit may amount to 1 arc seconds, in particular, 0.1 arc seconds and, more in particular 0.01 arc seconds.

According to further exemplary embodiments, the characteristic point of the quadrupole field is a point of highest symmetry of the quadrupole field in the selected plane.

In particular, the quadrupole field may be generated so that it comprises, e.g., two mirror symmetries oriented orthogonal to each other. The point of the quadrupole field where said two mirror symmetries intersect in the selected plain may be considered as the point of highest symmetry of the quadrupole field. At the point of the quadrupole field where said two mirror symmetries intersect, particles of the particle beam are not influenced by the quadrupole field with respect to their direction of propagation. Therefore, a ray of the particle beam, in particular, the central ray of the particle beam, is not deflected by the quadrupole field at the characteristic point.

Apparently, perfect symmetry of the quadrupole field may not be achieved, for example, due to imperfections in the manufacturing of the stigmator and a mechanical alignment of the stigmator. However, the energizing of the at least four field generators according to a setting of the plurality of settings may displace the characteristic point in the selected plane with respect to a geometric center of the stigmator. This displacement also distorts the symmetry of the quadrupole field. However, those skilled in the art will nevertheless consider the symmetry of the quadrupole field being preserved if the distortion is small.

According to further exemplary embodiments, the selected plane or a plane parallel to the selected plane intersects at least four of the at least four field generators of the stigmator. In this embodiment, the at least four field generators of the stigmator are essentially located in a plane perpendicular to the direction of propagation of the charged particle beam. Further field generators may be located such that a plane parallel to the selected plane, i.e. not intersecting the selected plane, intersects multiple further field generators and does not intersect the field generators intersected by the selected plane.

According to exemplary embodiments, the method further comprises acquiring at least one further first image and at least one further second image of the sample at different field strengths of the quadrupole field while energizing the at least four field generators according to at least one further setting of the plurality of settings of the at least four field generators so that the characteristic point of the quadrupole field is positioned at at least one further position in the selected plane of the stigmator when energizing the at least four field generators according to the at least one further setting, determining at least one further image displacement of the plurality of image displacements based on the at least one further first image and the at least one further second image, wherein the determining of the optimum setting of the at least four field generators comprises determining at least one optimized setting of the at least four field generators based on the plurality of image displacements and the plurality of settings of the at least four field generators, and determining the optimum setting of the at least four field generators based on the at least one optimized setting of the at least four field generators.

The accuracy of the method may be enhanced by using more than two image displacements and, accordingly, more than two settings of the at least four field generators. For this, further first and second images of the sample at different field strengths of the quadrupole field are acquired while the at least four field generators are energized according to the at least one further setting. The settings used may be mutually different so that the characteristic point of the quadrupole field is positioned at at least one further position in the selected plane of the stigmator different from the previously mentioned positions. Based on the at least one further first and second images at least one further image displacement is determined so that more than two image displacements and more than two settings may be used for determining the optimum setting of the at least four field generators. For this, several optimized settings of the at least four field generators are determined based on the plurality of image displacements and the plurality of settings. For example, having acquired fifths and sixths images of the sample, a third image displacement and a third setting may be used to determine optimized settings of the at least four field generators. Then, the first and second image displacements and the first and second settings may also be used to determine optimized settings. The optimum setting is then determined based on the optimized settings.

According to further exemplary embodiments, the determining of the optimum setting of the at least four field generators based on the at least one optimized setting of the at least four field generators comprises obtaining the optimum setting of the at least four field generators from one of the median value, the average value, the modal value and another mean value of the at least one optimized setting. Therefore, the optimum setting may be determined from multiple optimized settings by selecting, for example, the modal value of the optimized settings, i.e., an optimized setting determined at a highest frequency.

According to exemplary embodiments, a first and a second field generator of the at least four field generators are positioned at opposite sides of a region within the quadrupole field, the region being traversed by the charged particle beam. Furthermore, a third and a fourth field generator of the at least four field generators may be positioned at opposite sides of the region. In particular, the first, second, third and fourth field generator may be individual physical entities.

However, the stigmator may comprise, for example, eight field generators disposed circumferentially about the region within the quadrupole field traversed by the particle beam. In case the stigmator comprises eight field generators, the quadrupole field may be generated accordingly and, in contrast to the case of four field generators, also be rotatable about the beam or a main axis essentially parallel to the beam axis.

According to exemplary embodiments, each of the first and second settings of the at least four field generators is a tuple of a first value and a second value, wherein the first value is a value of a ratio of an amount by which the first field generator is energized and an amount by which the second field generator is energized, and the second value is a value of a ratio of an amount by which the third field generator is energized and an amount by which the fourth field generator is energized. In particular, the first and second settings differ with respect to each other in that the tuple of the first setting is different from the tuple of the second setting. In particular, the tuple of the first setting is different from the tuple of the second setting if at least one of their first values and their second values differ. Furthermore, a minimum difference between, for example, first values of the first and second settings may be defined so that respective values are considered different only if the difference of the respective values is larger than the minimum value.

According to this embodiment, each of the settings, e.g. the first, second and further settings, of the plurality of settings of the at least four field generators is characterized by the ratios of the amounts by which field generators positioned at opposite sides of the region within the quadrupole field, the region being traversed by the charged particle beam, are energized. Notably, the amounts itself by which the individual field generators are energized is not characteristic for a particular setting of the plurality of settings.

According to an exemplary embodiment, at least one energizer energizes only one of the at least four field generators of the stigmator. As a consequence, said one of the at least four field generators is individually energized and, hence, may be individually controlled. This allows to vary the ratio of the amounts by which said one field generator and a field generator positioned opposite to said one field generator, i.e. on opposite sides of the region being traversed by the particle beam, are energized. In turn, by varying said ratio, the quadrupole field may be displaced in one direction, in particular, the characteristic point of the quadrupole field may be displaced in one direction. For example, in the case of a magnetic stigmator, a first current source energizes only one of the at least four coils wherein a second current source energizes the remaining coils.

Alternatively, more than one of the at least four field generators of the stigmator may be individually energized and, thus, individually controllable. For example two of the at least four field generators may be energized individually, e.g. by distinct energizers or distinct energization amounts. In particular, said two of the at least four field generators may not be positioned at opposite sides of the region being traversed by the particle beam. In the latter case, this allows to vary the ratio of the amounts by which a first one of said two field generators and a field generator positioned opposite to said first one field generator are energized. In addition, the ratio of the amounts by which a second one of said two field generators and a field generator positioned opposite to said second one field generator are energized may be varied, as well. In turn, the quadrupole field may be displaced in two different directions, in particular, the characteristic point of the quadrupole field may be displaced in two different directions.

According to exemplary embodiments, each of the field generators of the stigmator may be energized individually, i.e. each of the field generators is energized by an individually controllable amount provided by at least one energizer. The amounts by which the field generators are energized may have, for certain settings, equal values, but are still individually controllable. For example, in case of a magnetic stigmator, each of the coils of the stigmator may be energized by supplying an individual current to each of the coils. In case of an electric stigmator, each of the electrodes may be energized by applying an individual voltage to each of the electrodes.

According to exemplary embodiments, the acquiring of images, in particular the acquiring of the first, second, third, fourth and further images, comprises one of deflecting the charged particle beam relative to the sample so that the beam is scanned across the sample and displacing the sample relative to the charged particle beam.

According to exemplary embodiments, the acquiring of images, in particular the acquiring of the first, second, third, fourth and further images, comprises detecting particles emerging from the sample using a detector. Particles emerging from the sample may be, for example, transmitted particles, backscattered particles and secondary particles, wherein the particles may be, for example, ions or electrons.

According to exemplary embodiments, the charged particle beam apparatus is one of an electron beam microscope, an ion beam microscope, a transmission electron microscope and a transmission ion microscope. In general, any particle beam apparatus comprising a stigmator to be adjusted may be subject to this method.

According to exemplary embodiments, the method further comprises adjusting the quadrupole field in the particle beam apparatus by energizing the at least four field generators according to the optimum setting. Having energized the at least four field generators according to the optimum setting the central ray of the particle beam traverses the stigmator at the characteristic point of the quadrupole field and, hence, the stigmator is adjusted in the particle beam apparatus.

Some embodiments provide a particle beam system configured to perform the methods previously described.

BRIEF DESCRIPTION OF THE DRAWINGS

The forgoing as well as other advantageous features of the disclosure will be more apparent from the following detailed description of exemplary embodiments with reference to the accompanying drawings. It is noted that not all possible embodiments necessarily exhibit each and every, or any, of the advantages identified herein.

DETAILED DESCRIPTION OF EXEMPLARY EMBODIMENTS

Figure 1:
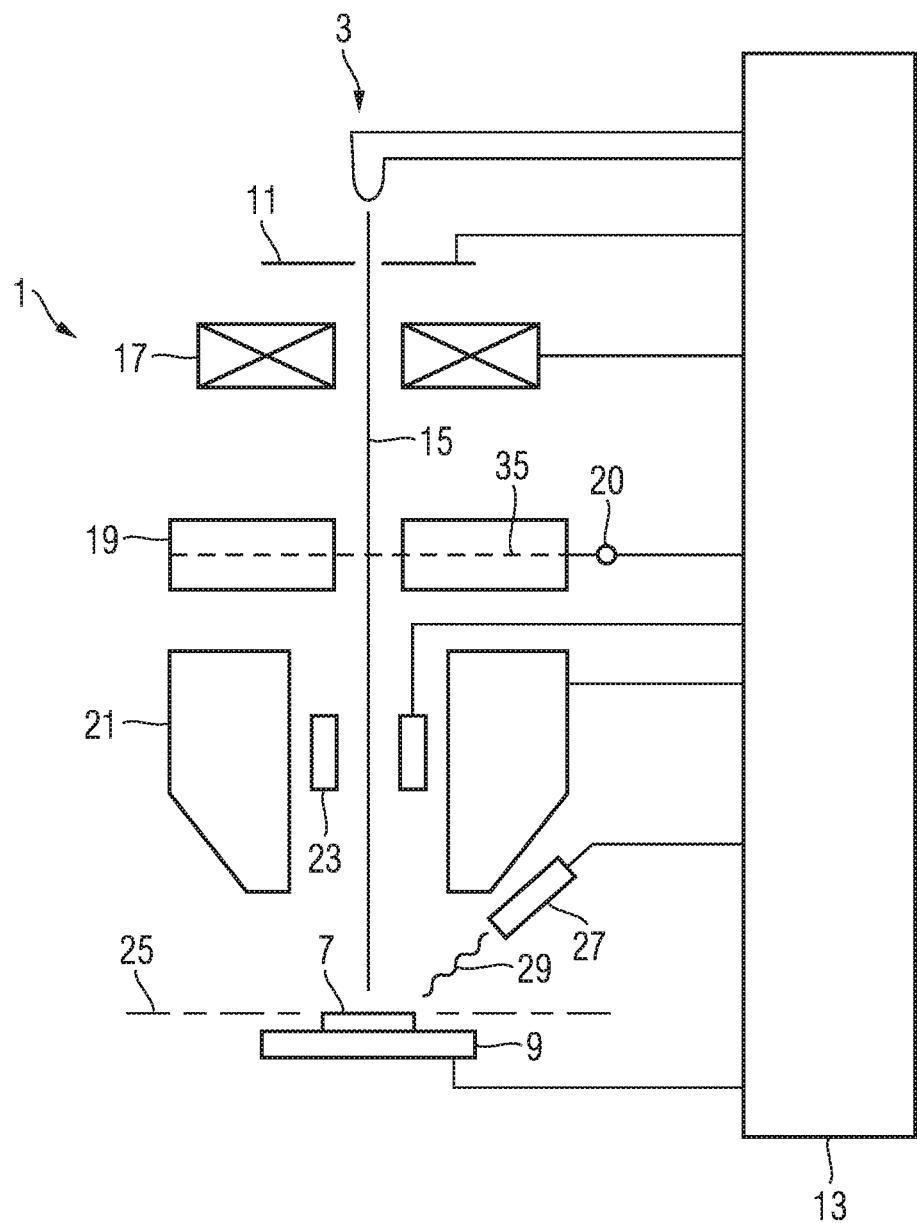
FIG. 1 shows a schematic illustration of a particle beam apparatus.

FIG. 1 shows a schematic illustration of a particle beam apparatus 1. The particle beam apparatus 1 may be, for example, an electron beam microscope. The particle beam apparatus 1 comprises a particle source 3 configured to generate particles upon appropriate energization by a controller 13. Charged particles provided by the particle source 3 are extracted from the source and accelerated towards a sample 7 disposed on a sample holder/stage 9 by extraction electrodes 11 disposed between the particle source 3 and the sample holder/stage 9. FIG. 1 shows a single extraction electrode 11, however, it should be understood that alternatively a plurality of (extraction) electrodes or a system of electrodes may be used, as well. The extraction electrodes 11 are controlled by the controller 13. For example, the controller 13 may control the extraction electrodes 11 by driving a driver unit (not shown) energizing the extraction electrodes 11.

A particle beam 15 is formed from the particles traversing the extraction electrodes 11 by a condenser lens 17 controlled by the controller 13.

The particle beam 15 traverses a stigmator 19 disposed downstream of the condenser lens 17. The stigmator 19 is connected to the controller 13 by an electric connection 20 and is controlled by the controller 13.

An objective lens 21 and a deflector 23 are disposed downstream of the stigmator 19.

The objective lens 21 and the deflector 23 are controlled by the controller 13. The objective lens 21 focuses the particle beam 15 onto an object plane 25 located in the vicinity of the sample 7. However, the objective lens may have an astigmatism so that different rays of the particle beam 15 may be focused to different locations located in planes coplanar to the object plane 25. For example, the objective lens may comprise pole pieces and windings which do not generate a perfectly aligned and (rotation) symmetric field. The stigmator 19 is configured to compensate the astigmatism of the objective lens 21 by appropriate focusing and spreading rays of the particle beam 15, respectively.

The deflector 23 may be used to deflect the particle beam 15 relative to the sample 7, for example, in order to scan the particle beam 15 across the sample 7 for acquiring an image of the sample 7. Alternatively, instead of deflecting the particle beam 15 by the deflector 23, the sample 7 may be displaced relative to the particle 15 by controlling the sample holder/stage 9 by the controller 13.

The particle beam apparatus 1 further comprises a detector 27 detecting particles emerging from the sample 7 as indicated by a line 29. The controller 13 may receive a detection signal output by the detector 27. The controller 13 is configured to generate images of the sample 7, for example, by controlling of at least one of the sample holder/stage 9 and the deflector 23 and processing the detection signal output by the detector 27.

The particle beam apparatus elucidated hereinbefore is contained in a vacuum chamber (not shown). The controller 13 may be disposed outside of said vacuum chamber.

Figure 2:
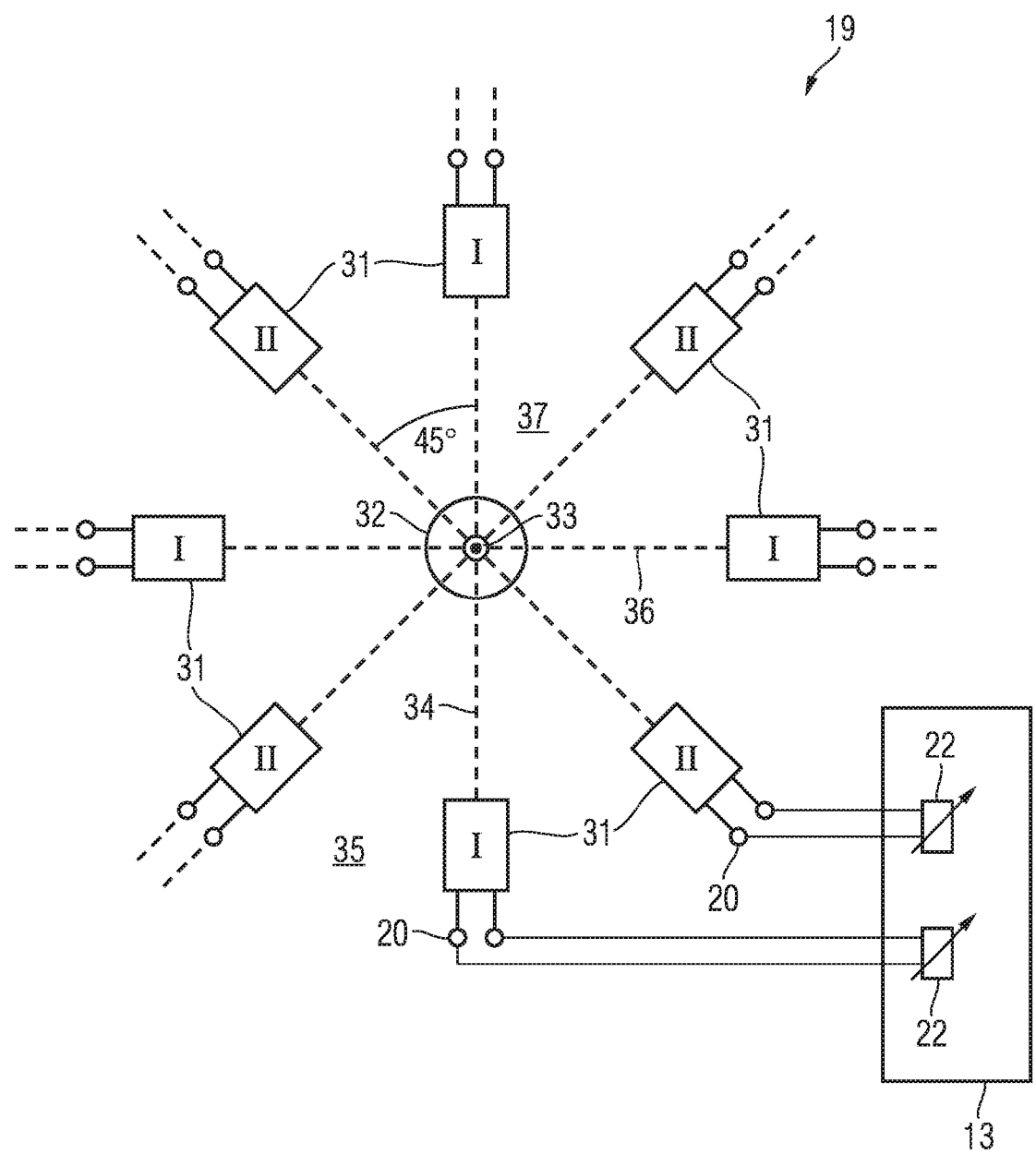
FIG. 2 shows a schematic configuration of a stigmator of the particle beam apparatus of FIG. 1, FIG. 3A to 3D schematically show field lines of a quadrupole field of the stigmator of FIG. 2.

FIG. 2 shows a schematic configuration of the stigmator 19. The stigmator 19 comprises eight field generators 31 disposed in a (symmetric) configuration about a geometric center 33 of the stigmator 19. The field generators 31 are disposed in a plane 35 represented by the plane of projection in FIG. 2. The plane 35 may be the selected plane according to some of the claims. As seen from FIG. 1, the plane 35 of the stigmator 19 is oriented orthogonal to the particle beam 15 and intersects the eight field generators 31.

It is emphasized that the stigmator 19 is not limited to eight field generators 31 as shown in FIG. 2. In general, the stigmator may comprise more (or less) than eight field generators, in particular, four, twelve or sixteen field generators. The field generators may be disposed around the geometric center 33 and/or in one or multiple (parallel) planes. Each field generator may consist of a magnetic coil having a cylindrical or conical shape or a shape of a rectangular block. Such coils may have a larger extension parallel to the beam axis compared to their extensions transverse, in particular orthogonal, to the beam axis in order to achieve a strong field. Field generators may also consist of multiple coils arranged relative to the beam axis, in particular parallel to the beam axis. A stigmator having stacked coils may provide a quadrupole field which has a larger extension along the particle beam axis compared to an extension essentially orthogonal to the beam axis.

The eight field generators 31 may be logically divided into a first group I and a second group II wherein field generators of the first and second groups are disposed alternatingly in a circumferential direction about the geometric center 33 of the stigmator 19, i.e., field generators of the first group I are located next to field generators of the second group II, and vice versa, in the plane 35.

Each of the field generators 31 is individually connected to the controller 13. As an example, FIG. 2 shows two of said individual connections 20 of two field generators to the controller 13. The connection of the other six field generators is indicated by dashed connection lines. Each of the field generators may be individually controlled, i.e., energized as indicated by control elements 22. However it is emphasized that it is not necessary to individually connect each of the field generators to the controller 13 or to individually energize each of the field generators. Alternatively, of each of the first and second groups, one or two individually controllable field generators may be sufficient, as well. In particular, of each of the first and second groups, two (or even three) field generators may be energized by a same energizer and, hence, be energized at a same amount The first group I comprises four field generators, in particular, a first and second field generator positioned at opposite sides of a region 32 being traversed by the particle beam 15. A third and fourth field generator of the group I are positioned at opposite sides of the region 32 in the plane 35, as well. For simplifying the understanding of the configuration, an axis traversing the first and second field generators of group I is illustrated by a straight dashed line 34, and an axis traversing the third and fourth field generators is illustrated by a straight dashed line 36. The field generators of the second group II may be arranged in a similar configuration but rotated about the geometric center 33 in the plane 35 about an angle amounting to 45°.

Each of the field generators 31 is connected to the controller 13 and individually controllable by the controller 13. In particular, each of the field generators 31 may generate an individual field according to an amount by which the field generator is energized. However, as described hereinbefore, it is not necessary that all field generators of the first group I (and/or the second group II) are individually controllable by the controller 13 and individually energized.

Within an area defined by the field generators 31, a quadrupole field 37 is generated. The quadrupole field 37 results from a superposition of the individual fields generated by each of the field generators 31. With this configuration of the stigmator 19, a quadrupole field of arbitrary strength and orientation may be generated by the field generators 31.

FIGS. 3A to 3D schematically show exemplary field lines 39 of the quadrupole field 37 in the plane 35. As a reference, the geometric center 33 of the stigmator 19 is also indicated. As illustrated with reference to FIG. 2, the quadrupole field 37 may be generated at arbitrary strength and orientation within the plane 35. In particular the quadrupole field 37 may be rotated about the geometric center 33 of the stigmator 19 within the plane 35. Therefore, the field lines 39 may be orientated along an arbitrary direction about the geometric center 33.

The following sections pertain only the first group I of the field generators 31 of the stigmator 19 having a total of eight field generators. However, the description is similarly valid for the second group II.

Figure 3A:
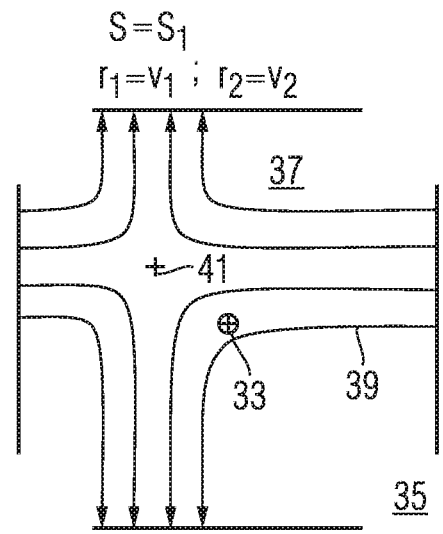

FIG. 3A shows field lines 39 of the quadrupole field 37 having a first field strength S=S1 indicated by a density of field lines 39 and a characteristic point 41 being positioned at a first position in the plane 35. The characteristic point 41 of the quadrupole field may be, for example, a point of highest symmetry of the quadrupole field 37 in the plane 35. In FIG. 3A, the quadrupole field 37 has two mirror symmetries intersecting at the characteristic point 41 in the plane 35. On the scale shown in FIG. 3A, the quadrupole field 37 does not seem to have a symmetry at all, however, on the scales of the particle beam interacting with the quadrupole field, the quadrupole field yet has two mirror symmetries regardless of minor imperfections. Alternatively, the characteristic point of the quadrupole field may be regarded as the point where a central ray of the particle beam 15 is not deflected by the quadrupole field or deflected by the quadrupole field by less than a predetermined angular limit.

The position of the characteristic point 41 of the quadrupole field 37 in the plane 35 depends on and may be controlled by a setting of the field generators, i.e., energizations of the field generators provided by the controller 13.

A setting such as the first setting may be a tuple of a first value $v_1$ and a second value $v_2$ wherein the first value $v_1$ is a value of a ratio $r_1$ of an amount by which the first field generator is energized and an amount by which the second field generator is energized, and the second value $v_2$ is a value of a ratio $r_2$ of an amount by which the third field generator is energized and an amount by which the fourth field generator is energized. For example, in the case of a magnetic stigmator, the first value $v_1$ of a setting may indicate the ratio $r_1$ of the strengths of currents by which the coils of the first and second field generators are energized. Similarly, the second value $v_2$ of said setting may indicate the value of a ratio $r_2$ of the strengths of the currents by which the coils of the third and the fourth field generators are energized. Therefore, a setting essentially comprises only ratios of the individual amounts by which the individual field generators are energized and, in particular, does not comprise absolute values of the individual amounts by which the individual field generators are energized. Thus, it is possible to provide a same setting using different absolute values of the amounts by which field generators positioned opposite to each other are energized.

Accordingly, in FIG. 3A, the characteristic point 41 of the quadrupole field 37 is positioned at the first position in the plane by energizing the field generators according to a first setting ($r_1=v_1$; $r_2=v_2$).

A first image of the sample is acquired at a field strength S=S1 of the quadrupole field while the field generators are energized according to the first setting ($r_1=v_1$; $r_2=v_2$).

Figure 3B:
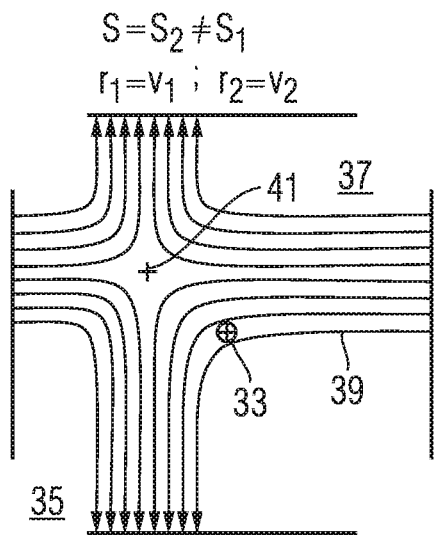

FIG. 3B shows field lines 39 of the quadrupole field 37 in the plane 35 wherein the field generators are energized according to the first setting ($r_1=v_1$; $r_2=v_2$), as in the case of FIG. 3A. Hence, the characteristic point 41 of the quadrupole field 37 is positioned at the first position in the plane, as in the case of FIG. 3A. However, the field strength of the quadrupole field is increased compared to that of FIG. 3A indicated by a higher density of field lines 39, i.e., S=S2 wherein S2>S1.

A second image of the sample is acquired at the second field strength S=S2 of the quadrupole field wherein the first and second field strengths of the quadrupole field differ from each other by at least a predetermined value. Examples of the predetermined value are 1%, 2% or 5% of a maximum field strength of the stigmator. For example, in the case of a magnetic stigmator, the predetermined value may amount to values in the range of few mA (milli-Ampere).

Figure 3C:
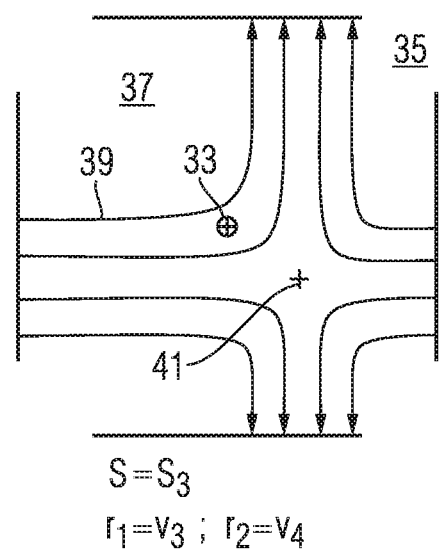

FIG. 3C shows field lines 39 of the quadrupole field 37 in the plane 35. In contrast to the FIGS. 3A and 3B, the field generators of the stigmator are energized according to a second setting ($r_1=v_1$; $r_2=v_4$) different from the first setting. Hence, the characteristic point 41 of the quadrupole field 37 is positioned at a second position in the plane, the second position being different from the first position. In particular, the first and second settings may be different in that at least one of the first and second values of said settings differ from each other. FIG. 3C shows the quadrupole field 37 having a third field strength S=S3 indicated by the density of field lines 39.

A third image of the sample is acquired at the third field strength S=S3 of the quadrupole field 37 while the field generators are energized according to the second setting.

Figure 3D:
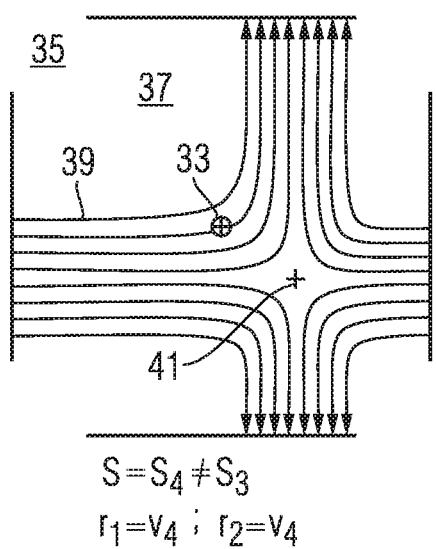

FIG. 3D shows field lines 39 of the quadrupole field 37 wherein the field generators are energized according to the same second setting, hence, the characteristic point 41 of the quadrupole field 37 is positioned at the same second position in the plane, as in the case of FIG. 3C. However, the quadrupole field has a fourth field strength different from the third field strength as indicated by an increased density of field lines compared that of FIG. 3C, i.e., S=S4 wherein S4>S3.

A fourth image of the sample is acquired at the fourth field strength S=S4 of the quadrupole field while the field generators are energized according to second setting.

A plurality of image displacements is determined based on images acquired while energizing the field generators according to a same setting and different field strengths. For example, a first image displacement $d_1$ is determined based on the first and second images acquired using the first setting, and a second image displacement $\vec{d}_2$ is determined based on the third and fourth images acquired using the second setting.

Figure 5:
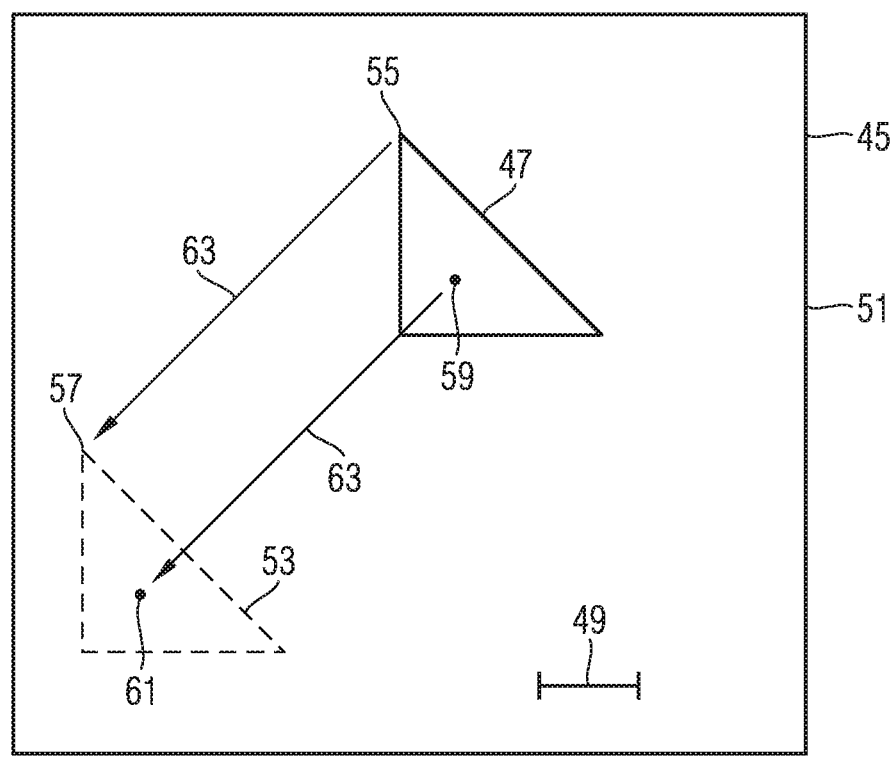
FIG. 5 shows a schematic illustration of an exemplary image displacement.

An example of an image displacement is illustrated with reference to FIG. 5. FIG. 5 shows an image 45 of at least a portion of the sample 7, in particular a triangular structure 47 indicated by solid lines. Furthermore the image 45 contains a scale bar 49 which is, however, added to the raw image after acquiring the raw image containing the triangular structure 47. The scale bar 49 indicates the scale of the image. Typically, the length of the scale bar represents values on the order of 1 μm, 100 nm or the like.

The image 45 is acquired while energizing the at least four field generators according to a particular setting, for example one of the optimum setting, an optimized setting and the first and second settings of the plurality of settings. Furthermore, the at least four field generators are energized according to a particular field strength while energizing the at least four field generators according to the particular setting.

FIG. 5 shows another image 51 of at least a portion of the sample 7, in particular a triangular structure 53 indicated by dashed lines. Furthermore, the image 51 may contain the scale bar 49. The image 51 is acquired while energizing the at least four field generators according to the same particular setting as was used during the acquisition of image 45. Furthermore, during acquisition of the image 51, the at least four field generators are energized according to a field strength different to the particular field strength used during the acquisition of image 45. The field strengths used or an excitation of the at least four field generators used to generate the field strengths may differ by at least a minimum value, such as 0.5%, 1%, 2% or the like of a maximum excitation of the at least four field generators.

For simplicity, the image size and magnification are identical, however, in practice, the image size and/or magnification may differ slightly between the images 45 and 51. The image 45 of the triangular structure 47 and the image 51 of the triangular structure 53 are acquired from a same structure resident on the sample 7, i.e., the images 45 and 51 show at least in parts a same area of the sample 7.

In FIG. 5, both the images 45 and 51 are aligned with respect to one another in a way that frames of the images 45 and 51 are located on each other. Consequently, in a coordinate system spanned by, for example, a common frame of the images 45 and 51, the triangular structures 47 and 53 are located at different positions with respect to this coordinate system. This difference in position on the scale of the image may be regarded as an image displacement. For this, a structural feature, such as vertices 55 and 57 or centroids 59 and 61, of the triangular structures 47 and 53 may serve as an indicator for the positions of the triangular structures. Based on the positions of the triangular structures indicated by, for example positions of the vertices or centroids, an image displacement indicated by the arrows 63 between the images 45 and 51 may be determined on the scale of the images 45 and 51. In the example illustrated in FIG. 5, assuming a scale of 100 nm, the image displacement between the images 45 and 51 amounts to approximately 450 nm.

It is emphasized that the images 45 and 51, in particular the triangular structures 47 and 53, were chosen for illustrative purposes only. In practice, the image displacement may be determined based on arbitrarily shaped structures common to two images obtained at a same setting and at different field strengths.

Figure 4A:
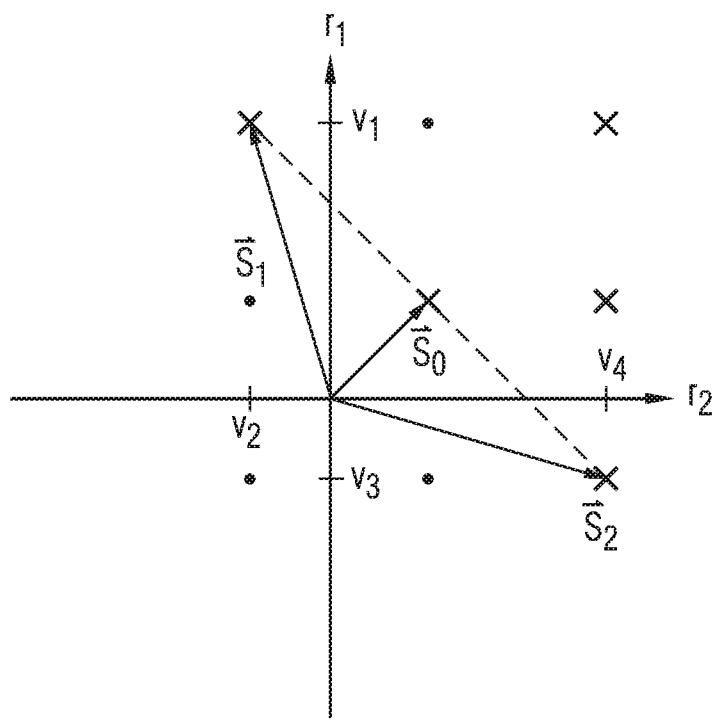
FIG. 4A shows a schematic illustration of a plurality of settings of the stigmator of FIG. 2.

FIG. 4A shows a schematic illustration of a plurality of settings of the stigmator, wherein the plurality of settings comprises settings used for acquiring image displacements. For example, the plurality of settings comprises the first setting $\vec{s}_1$ and the second setting $\vec{s}_2$ used to acquire the first, second, third and fourth images and, hence, the first and second image displacements $\vec{d}_1$ and $\vec{d}_2$. In addition to the settings used to determine the first and second image displacements, further possible settings are shown in FIG. 4A. The settings are illustrated by points and x-shaped marks in a coordinate system spanned by a first ratio $r_1$ and a second ratio $r_2$ of a tuple of a setting. In particular, the vector s, indicates the first setting, for example, $r_1=v_1$ and $r_1=v_2$. Similarly, $\vec{s}_2$ indicates the second setting, for example, $r_1=v_3$ and $r_2=v_4$. Settings shown in FIG. 4A are arranged in a pattern about an unknown optimum setting $\vec{s}_0$. When the field generators are energized according to the optimum setting $\vec{s}_0$, i.e. $\vec{s}=\vec{s}_0$, the image displacement vanishes, i.e., $\vec{d}=0$.

Figure 4B:
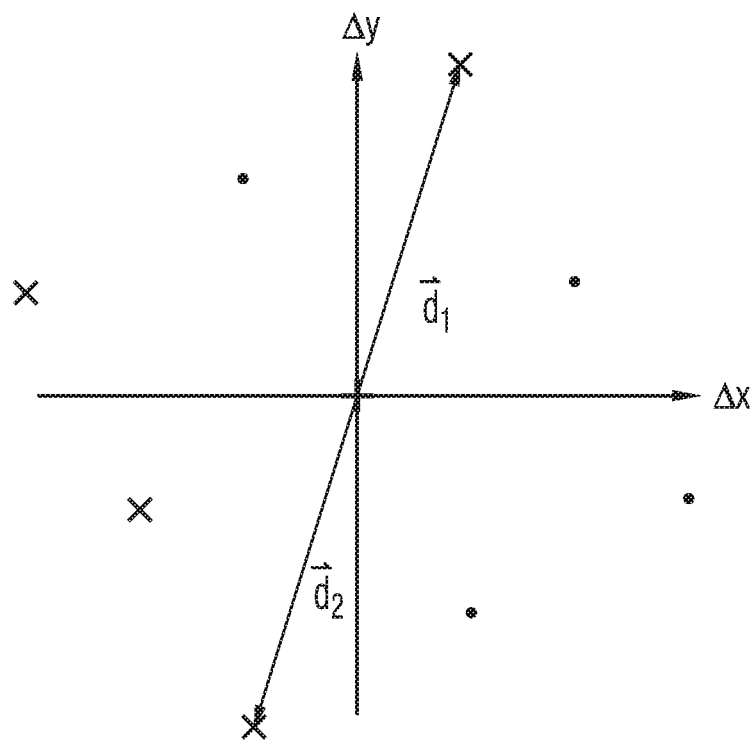
FIG. 4B shows a schematic illustration of a plurality of image displacements.

FIG. 4B shows a schematic illustration of a plurality of image displacements that would be obtained for the plurality of settings illustrated in FIG. 4A. An image displacement shown in FIG. 4B is characterized by the displacement in the x- and y-directions, i.e. the displacements $\Delta x$ and $\Delta y$, respectively. In particular, $\vec{d}_1$ indicates the first image displacement determined based on the first and second images acquired using the first setting represented by vector $\vec{s}^1$ in FIG. 4A. Furthermore, the vector $\vec{d}_2$ indicates the second image displacement determined based on the third and fourth images acquired using the second setting represented by $\vec{s}_2$ in FIG. 4A.

As can be seen by comparing FIGS. 4A and 4B, the pattern of the plurality of settings is transformed to the plurality of image displacements by an operation of scaling, an operation of rotation, an operation of conjugation and an operation of displacement. That is, the pattern of the plurality of settings is preserved so that the transformation of the plurality of settings to the plurality of image displacements may be regarded as a linear transformation. Notably, the operation of displacement is directly connected to the optimum setting $\vec{s}_0$.

Therefore, the transformation may be expressed as $$\vec{d}=kR_\phi(\vec{s}-\vec{s}_0)^*, \qquad (1)$$

wherein $\vec{d}$ denotes an image displacement occurring in accordance with a setting $\vec{s}$, $\vec{s}_0$ denotes the optimum setting, k is a linear scaling term. $R_\phi$ is an operation of rotation and * is an operator of conjugation. Note that equation (1) is an approximation of the behavior of the stigmator and the particle beam apparatus observed based on an experiment.

Based on equation (1), a mathematical formula for the optimum setting $\vec{s}_0$ can be determined, the only constituents of said mathematical formula are the plurality of image displacements (for example, $\vec{d}_1$ and $\vec{d}_2$) and the plurality of settings (for example $\vec{s}_1$ and $\vec{s}_2$). Therefore, the optimum setting of the field generators can be determined based on the plurality of image displacements and the plurality of settings.

When the optimum setting $\vec{s}_0$ is used as the setting of the field generators, the central ray of the particle beam traverses the plane at the characteristic point of the quadrupole field. Hence, the quadrupole field generated by the field generators of the first group I of the stigmator may be adjusted by energizing the field generators according to the optimum setting.

An essential aspect of the method described hereinbefore is that the determining of the optimum setting of the field generators is independent of parameters representing properties of the particle beam, in particular an axis deviation of the particle beam from an optical axis of, for example, the objective lens 21, and the particle optical system of the particle apparatus. The only necessary constituents of the mathematical formula used to determine the optimum setting of the field generators are the plurality of image displacements and the plurality of settings. However, at least one constant and/or at least one parameter independent of the plurality of the image displacements and independent of the plurality of settings may enter said mathematical formula as well.

However, it should be mentioned that, for fully adjusting a particle beam system comprising a stigmator and at least an objective lens, at first, the particle beam is aligned relative to an optical axis of the objective lens and, in a potentially final step, the stigmator is aligned relative to the particle beam.

An example of the mathematical formula used to determine the optimum setting is $$\vec{s}_0 = H\left[\frac{F\vec{d}_1 \cdot G\vec{s}_2 - F\vec{d}_2 \cdot G\vec{s}_1}{F(\vec{d}_1 - \vec{d}_2)}\right]$$

wherein $\vec{s}_0$ denotes a two-dimensional representation of the optimum setting, $\vec{d}_1$ and $\vec{d}_2$ denote a two-dimensional representation of the first and second image displacements, respectively, $\vec{s}_1$ and $\vec{s}_2$ denote a two-dimensional representation of the first and second settings, respectively, F denotes an operator acting on $\vec{d}_1$ and $\vec{d}_2$, G denotes an operator acting on $\vec{s}_1$ and $\vec{s}_2$, and H denotes an operator acting on $$\frac{F\vec{d}_1 \cdot G\vec{s}_2 - F\vec{d}_2 \cdot G\vec{s}_1}{F(\vec{d}_1 - \vec{d}_2)}.$$

A further example of the mathematical formula used to determine the optimum setting is $$s_0 = \frac{F\underline{d}_1 \cdot \underline{s}_2 - F\underline{d}_2 \cdot \underline{s}_1}{F(\underline{d}_1 - \underline{d}_2)}$$

wherein $\underline{s}_0$ denotes a complex number representing the optimum setting, $\underline{d}_1$ and $\underline{d}_2$ denote complex numbers representing the first and second image displacements, respectively, $\underline{s}_1$ and $\underline{s}_2$ denote complex numbers representing the first and second settings, respectively, and F denotes an operator acting on $\underline{d}_1$ and $\underline{d}_2$ and comprising at least one of an operation of scaling and an operation of conjugation.

In the above description, the optimum setting of the field generators was determined based on the first and second image displacements and the first and second settings of the field generators. However, instead of using only two image displacements and two settings, a greater number of image displacements and settings may be used in order to determine the optimum setting. For this, further first and second images of the sample are acquired at different field strengths of the quadrupole field while energizing the field generators according to at least one further setting of the plurality of settings so that the characteristic point of the quadrupole field is positioned at at least one further position in the plane. Based on said further first and second images, further image displacements of the plurality of image displacements may be determined and used to determine the optimum setting of the field generators. Having more than two image displacements and more than two settings determined, the mathematical formula may be evaluated, for example, for each combination of two image displacements of the plurality of image displacements and according settings. Thus, at least one optimized setting of the field generators may be determined based on the plurality of image displacements and the plurality of settings. Based on the at least one optimized setting, the optimum setting may be determined, for example, by obtaining the optimum value as one of the median value, the average value, the modal value and another mean value of the at least one optimized setting.

Hereinbefore, some embodiments of a method of adjusting a stigmator have been described using the field generators of the first group I (see FIG. 2). Said methods may also be used for the field generators of the second group II. Hence, the stigmator of FIG. 2 comprising eight field generators may be adjusted by acquiring a total of eight images using four settings, determining four image displacements and determining two optimum settings, one for each of the field generators of the groups I and II, respectively.

Furthermore, the methods described hereinbefore may be performed by the controller 13 in a fully automated way.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

The invention claimed is:

1. A method of adjusting a stigmator in a charged particle beam apparatus, wherein the method comprises:
   directing a charged particle beam onto a sample wherein the charged particle beam traverses a quadrupole field generated by energizing at least four field generators of the stigmator,
   acquiring first and second images of the sample at different field strengths of the quadrupole field while energizing the at least four field generators according to a first setting of a plurality of settings of the at least four field generators,
   acquiring third and fourth images of the sample at different field strengths of the quadrupole field while energizing the at least four field generators according to a second setting of a plurality of settings of the at least four field generators,
   determining a plurality of image displacements, wherein a first image displacement of the plurality of image displacements is determined based on the first and second images and wherein a second image displacement of the plurality of image displacements is determined based on the third and fourth images, determining an optimum setting of the at least four field generators based on the plurality of image displacements and the plurality of settings of the at least four field generators so that an image displacement between two images acquired while energizing the at least four field generators according to the optimum setting at field strengths differing from each other by 1% of a maximum excitation of the at least four field generators is less than a predetermined limit, wherein the maximum excitation of the at least four field generators is a largest value of maximum excitations of each of the at least four field generators, wherein the optimum setting of the at least four field generators is determined by evaluating a mathematical formula, the only constituents of which are two image displacements of the plurality of image displacements, the plurality of settings used for acquiring images based on which the two image displacements were determined and at least one of at least one constant and at least one parameter, wherein the at least one parameter is independent of the plurality of image displacements and independent of the plurality of settings.

2. The method according to claim 1, wherein the determining of the optimum setting of the at least four field generators is free of determining at least one parameter depending on at least one of the properties of the charged particle beam, an axis deviation of the charged particle beam from an optical axis of an objective lens, and a particle optical system of the charged particle beam apparatus.

3. The method according to claim 1, wherein the mathematical formula is given by or representable as:

$$\vec{s}_0 = H\left[\frac{F\vec{d}_1 \cdot G\vec{s}_2 - F\vec{d}_2 \cdot G\vec{s}_1}{F(\vec{d}_1 - \vec{d}_2)}\right]$$

wherein $\vec{s}_0$ denotes a two-dimensional representation of the optimum setting, $\vec{d}_1$ and $\vec{d}_2$ denote a two-dimensional representation of the first and second image displacements, respectively, $\vec{s}_1$ and $\vec{s}_2$ denote a two-dimensional representation of the first and second settings, respectively, F denotes an operator acting on $\vec{d}_1$ and $\vec{d}_2$, G denotes an operator acting on $\vec{s}_1$ and $\vec{s}_2$, and H denotes an operator acting on $$\frac{F\vec{d}_1 \cdot G\vec{s}_2 - F\vec{d}_2 \cdot G\vec{s}_1}{F(\vec{d}_1 - \vec{d}_2)}.$$

4. The method according to claim 3, wherein the operators F, G and H comprise at least one of an operation of scaling, an operation of rotation, an operation of inversion, an operation of conjugation and an operation of transposing.

5. The method according to claim 1, wherein the mathematical formula is given by or representable as:

$$s_0 = \frac{Fd_1 \cdot s_2 - Fd_2 \cdot s_1}{F(d_1 - d_2)}$$

wherein $s_0$ denotes a complex number representing the optimum setting, $d_1$ and $d_2$ denote complex numbers representing the first and second image displacements, respectively, $s_1$ and $s_2$ denote complex numbers representing the first and second settings, respectively, and F denotes an operator acting on $d_1$ and $d_2$ and comprising at least one of an operation of scaling and an operation of conjugation.

6. The method according to claim 1, wherein the following observations hold for a plane selected such that it is oriented orthogonally to the charged particle beam and such that it intersects at least one of the at least four field generators:

a characteristic point of the quadrupole field is positioned at a first position in the selected plane when energizing the at least four field generators according to the first setting, the characteristic point of the quadrupole field is positioned at a second position in the selected plane when energizing the at least four field generators according to the second setting, and a central ray of the charged particle beam is deflected by the quadrupole field by less than a predetermined angular limit when the charged particle beam traverses the quadrupole field through the characteristic point.

7. The method according to claim 6, wherein the characteristic point of the quadrupole field is a point of highest symmetry of the quadrupole field in the selected plane.

8. The method according to claim 6, wherein the selected plane intersects at least four of the at least four field generators of the stigmator.

9. The method according to claim 6, wherein the method further comprises:

acquiring at least one further first image and at least one further second image of the sample at different field strengths of the quadrupole field while energizing the at least four field generators according to at least one further setting of the plurality of settings of the at least four field generators so that the characteristic point of the quadrupole field is positioned at least one further position in the selected plane when energizing the at least four field generators according to the at least one further setting, determining at least one further image displacement of the plurality of image displacements based on the at least one further first image and the at least one further second image, wherein the determining of the optimum setting of the at least four field generators comprises determining at least two optimized settings of the at least four field generators based on the plurality of image displacements and the plurality of settings of the at least four field generators, and determining the optimum setting of the at least four field generators based on the at least two optimized settings of the at least four field generators.

10. The method according to claim 9, wherein the determining of the optimum setting of the at least four field generators based on the at least two optimized settings of the at least four field generators comprises obtaining the optimum setting of the at least four field generators from one of the median value, the average value, and the modal value of the at least two optimized settings.

11. The method according to claim 1, wherein a first and a second field generator of the at least four field generators are positioned at opposite sides of a region within the quadrupole field, the region being traversed by the charged particle beam, and wherein a third and a fourth field generator of the at least four field generators are positioned at opposite sides of the region.

12. The method according to claim 11, wherein each of the first and second settings is a tuple of a first value and a second value, wherein the first value is a value of a ratio of an amount by which the first field generator is energized and an amount by which the second field generator is energized, and the second value is a value of a ratio of an amount by which the third field generator is energized and an amount by which the fourth field generator is energized, and wherein the first and the second settings differ with respect to each other in that the tuple of the first setting is different from the tuple of the second setting.

13. The method according to claim 1, wherein at least one energizer energizes only one of the at least four field generators.

14. The method according to claim 1, wherein the acquiring of images comprises one of deflecting the charged particle beam relative to the sample and displacing the sample relative to the charged particle beam.

15. The method according to claim 1, wherein the acquiring of images comprises detecting particles emerging from the sample using a detector.

16. The method according to claim 1, wherein the charged particle beam apparatus is one of an electron beam microscope, an ion beam microscope, a transmission electron microscope and a transmission ion microscope.

17. The method according to claim 1, further comprising adjusting the quadrupole field in the charged particle beam apparatus by energizing the at least four field generators according to the optimum setting.

18. The method according to claim 1, wherein the predetermined limit amounts to 100 nm.

19. A charged particle beam system configured to perform the method according to claim 1.

* * * * *